(12) United States Patent
Carter

(10) Patent No.: US 8,038,752 B2
(45) Date of Patent: Oct. 18, 2011

(54) METAL ION-CONTAINING CMP COMPOSITION AND METHOD FOR USING THE SAME

(75) Inventor: Phillip W. Carter, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 10/974,460

(22) Filed: Oct. 27, 2004

(65) Prior Publication Data

US 2006/0086055 A1    Apr. 27, 2006

(51) Int. Cl.
*C09G 1/02* (2006.01)
*C09G 1/04* (2006.01)
*H01L 21/302* (2006.01)
*H01L 21/304* (2006.01)

(52) U.S. Cl. .......................................... 51/309; 51/307
(58) Field of Classification Search .................... 51/307, 51/308, 309, 298; 106/3
See application file for complete search history.

(56) References Cited

U.S. PATENT DOCUMENTS

| | | | |
|---|---|---|---|
| 4,671,851 A | 6/1987 | Beyer et al. | |
| 4,789,648 A | 12/1988 | Chow et al. | |
| 4,910,155 A | 3/1990 | Cote et al. | |
| 4,944,836 A | 7/1990 | Beyer et al. | |
| 4,956,313 A | 9/1990 | Cote et al. | |
| 4,959,113 A * | 9/1990 | Roberts | 216/89 |
| 5,137,544 A | 8/1992 | Medellin | |
| 5,157,876 A | 10/1992 | Medellin | |
| 5,209,816 A | 5/1993 | Yu et al. | |
| 5,244,534 A | 9/1993 | Yu et al. | |
| 5,340,370 A | 8/1994 | Cadien et al. | |
| 5,354,490 A | 10/1994 | Yu et al. | |
| 5,366,542 A | 11/1994 | Yamada et al. | |
| 5,391,258 A | 2/1995 | Brancaleoni et al. | |
| 5,476,606 A | 12/1995 | Brancaleoni et al. | |
| 5,527,423 A | 6/1996 | Neville et al. | |
| 5,741,626 A | 4/1998 | Jain et al. | |
| 5,770,095 A | 6/1998 | Sasaki et al. | |
| 5,958,288 A | 9/1999 | Mueller et al. | |
| 6,251,150 B1 | 6/2001 | Small et al. | |
| 6,379,406 B1 | 4/2002 | Thomas et al. | |
| 6,589,100 B2 | 7/2003 | Moeggenborg et al. | |
| 6,641,631 B2 | 11/2003 | Thomas et al. | |
| 6,730,245 B2 * | 5/2004 | Hampden-Smith et al. | 264/7 |
| 7,153,335 B2 * | 12/2006 | Siddiqui et al. | 51/307 |
| 2002/0010232 A1 * | 1/2002 | Ogawa et al. | 523/448 |
| 2002/0039839 A1 | 4/2002 | Thomas et al. | |
| 2003/0104770 A1 * | 6/2003 | Pasqualoni et al. | 451/60 |
| 2003/0124959 A1 * | 7/2003 | Schroeder et al. | 451/41 |
| 2003/0196386 A1 * | 10/2003 | Hattori et al. | 51/307 |
| 2005/0279733 A1 * | 12/2005 | Carter et al. | 216/88 |

FOREIGN PATENT DOCUMENTS

| | | |
|---|---|---|
| EP | 0 845 512 A1 | 6/1998 |
| EP | 1 211 024 A2 | 6/2002 |
| WO | WO 99/53532 A1 | 10/1999 |
| WO | WO 02/055259 A2 | 7/2002 |
| WO | WO 02/055259 A3 | 9/2002 |
| WO | WO 03/068882 | 8/2003 |
| WO | WO 2006/009640 | 1/2006 |

OTHER PUBLICATIONS

Dugger et al., *The Journal of Physical Chemistry*, 68(4), 757-760 (1964).

* cited by examiner

*Primary Examiner* — Jerry A Lorengo
*Assistant Examiner* — Jared Wood
(74) *Attorney, Agent, or Firm* — Thomas E. Omholt; Victor Song; Nancy J. Gettel

(57) ABSTRACT

The invention provides a chemical-mechanical polishing composition comprising an abrasive, metal ions (M) having a M-O—Si bond energy equal to or greater than about 3 kcal/mol, and water. The invention further provides a method for polishing a substrate using the aforementioned chemical-mechanical polishing composition.

19 Claims, No Drawings

METAL ION-CONTAINING CMP COMPOSITION AND METHOD FOR USING THE SAME

FIELD OF THE INVENTION

This invention pertains to a chemical-mechanical polishing composition and a method of polishing a substrate using the same.

BACKGROUND OF THE INVENTION

Integrated circuits are made up of millions of active devices formed in or on a substrate, such as a silicon wafer. The active devices are chemically and physically connected onto a substrate and are interconnected through the use of multilevel interconnects to form functional circuits. Typical multilevel interconnects comprise a first metal layer, an interlevel dielectric layer, and sometimes a third and subsequent metal layers. Interlevel dielectrics, such as doped and undoped silicon dioxide ($SiO_2$) and/or low-κ dielectrics, are used to electrically isolate the different metal layers.

The electrical connections between different interconnection levels are made through the use of metal vias. U.S. Pat. No. 5,741,626, for example, describes a method for preparing dielectric TaN layers. Moreover, U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts may be filled with various metals and alloys, such as, for example, titanium (Ti), titanium nitride (TiN), aluminum copper (Al—Cu), aluminum silicon (Al—Si), copper (Cu), tungsten (W), and combinations thereof (hereinafter referred to as "via metals").

The via metals generally employ an adhesion layer (i.e., a barrier film), such as a titanium (Ti), titanium nitride (TiN), tantalum (Ta), tantalum nitride (TaN), tungsten (W), or tungsten nitride (WN) barrier film, to adhere the via metals to the $SiO_2$ substrate. At the contact level, the barrier film acts as a diffusion barrier to prevent the via metals from reacting with $SiO_2$.

In one semiconductor manufacturing process, metal vias and/or contacts are formed by a blanket metal deposition followed by a chemical-mechanical polishing (CMP) step. In a typical process, via holes are etched through an interlevel dielectric (ILD) to interconnection lines or to a semiconductor substrate. Next, a barrier film is formed over the ILD and is directed into the etched via hole. Then, a via metal is blanket-deposited over the barrier film and into the via hole. Deposition is continued until the via hole is filled with the blanket-deposited metal. Finally, the excess metal is removed by chemical-mechanical polishing (CMP) to form metal vias. Processes for manufacturing and/or CMP of vias are disclosed in U.S. Pat. Nos. 4,671,851, 4,910,155, and 4,944,836.

CMP combines a chemical treatment of a substrate with a mechanical removal of the chemically treated layer. Typical CMP systems contain a chemical-mechanical polishing composition which is applied to a substrate between the substrate and a polishing pad that is moved relative to the substrate to effect the polishing of the substrate. CMP is becoming a more important process in the manufacture of semiconductor surfaces because more active devices are being packed into smaller areas in substrates and because unconventional metals, such as copper, are being used in order to improve the over-all performance of the circuits. More active devices in a given area on a semiconductor substrate require better planarization techniques due to the unevenness of the topography formed by the active devices themselves or of the topography of the layers formed over the active devices. Because many layers of metals and ILDs are formed successively one on top of another, each layer needs to be planarized to a high degree if higher resolution lithographic processes are to be used to form smaller and a higher number of active devices on a layer in a substrate.

The mechanical kinetics of CMP for a blanket deposited metal into vias in an ILD is explained by the Preston equation given by:

$$(\Delta H/\Delta t) = K_p (L/A)(\Delta s/\Delta t),$$

where $\Delta H/\Delta t$ is the removal rate of the material in terms of change in height per unit time of polishing, L is the load imposed over a surface area A, $\Delta s/\Delta t$ is the relative velocity of the pad to the substrate, and $K_p$ is Preston's coefficient. The equation predicts that, for a given (L/A), the weight loss of the polished material is proportional to the amount of travel, and it remains invariant with time. The polishing rate increases with the pressure (L/A) and velocity. In other words, the removal rate is a linear function of pressure, so that high points are polished more rapidly, and the surface quickly becomes planar.

A CMP system ideally results in a polished planar surface without residual metal films on the polished surface of the ILD, and with all of the vias having metal at heights that are even with the level of the polished surface of the ILD. However, once the high points are quickly polished, the load is shared by lower points which are now within reach of the pad, thereby resulting in a relatively lower polishing pressure. After total removal of the metal layer from the surface of the ILD, the polishing is shared between the metal layer that is level with the ILD surface and the ILD itself. Since the polishing rate of the metal is different from that of the ILD, and, in the case of copper, greater than that of the ILD, metal is removed from further below the level of the ILD, thus leaving spaces. The formation of these spaces is known in the art as dishing.

Severe dishing in large metal active devices is a source of yield loss, especially when it occurs at lower levels of the substrate, where dishing causes trapped metal defects in the above lying layer(s). Furthermore, the longer time needed to remove the thicker metal overburden on the narrowest metal vias is one of the main culprits responsible for the low throughput and yield loss in the CMP process.

Typical metal CMP compositions contain an abrasive material, such as silica or alumina, suspended in an oxidizing, aqueous medium. U.S. Pat. No. 5,244,534, for example, discloses a chemical-mechanical polishing composition containing alumina, hydrogen peroxide, and either potassium or ammonium hydroxide, which is useful in removing tungsten with little removal of the underlying insulating layer. U.S. Pat. No. 5,209,816 discloses a chemical-mechanical polishing composition useful for polishing aluminum that comprises perchloric acid, hydrogen peroxide, and a solid abrasive material in an aqueous medium. U.S. Pat. No. 5,340,370 discloses a tungsten polishing composition comprising potassium ferricyanide, potassium acetate, acetic acid, and silica. U.S. Pat. No. 5,391,258 and U.S. Pat. No. 5,476,606 disclose chemical-mechanical polishing compositions for polishing a composite of metal and silica which includes an aqueous medium, abrasive particles, and an anion which controls the rate of silica removal. U.S. Pat. No. 5,770,095 discloses polishing compositions comprising an oxidizing agent, a chemical agent, and an etching agent selected from aminoacetic acid and amidosulfuric acid. Other polishing compositions for use in CMP applications are described in U.S. Pat. Nos. 4,956,313, 5,137,544, 5,157,876, 5,354,490, and 5,527,423.

Barrier films of titanium, titanium nitride, and like metals, such as tungsten, are chemically active in general. Thus, such barrier films are similar in chemical nature to via metals. As a result, a single polishing composition can be used effectively to polish both Ti/TiN barrier films and via metals at similar rates. Ta and TaN barrier films, however, are significantly different from Ti, TiN, and like barrier films. Ta and TaN are relatively inert in chemical nature as compared to Ti and TiN. Accordingly, the aforementioned polishing compositions are significantly less effective at polishing tantalum layers than they are at polishing titanium layers (e.g., the tantalum removal rate is significantly lower than the titanium removal rate). While via metals and barrier metals are conventionally polished with a single composition due to their similarly high removal rates, joint polishing of via metals and tantalum and similar materials using conventional polishing compositions can result in undesirable effects, such as oxide erosion and via metal dishing.

In many CMP operations, silicon dioxide is utilized as the underlying dielectric material. Examples of such operations are: Shallow Trench Isolation (STI), Cu/Ta damascene metal polish, and tungsten plug formation. For all of these CMP operations, erosion of the underlying dielectric material can lead to an excessive localized removal of the material being polished (e.g., nitride for STI, Cu for Cu/Ta polishing, and tungsten for tungsten plugs). In addition, changes in the thickness of the dielectric material can result in an unpredictable electrical performance and can also reduce planarity of the polished layers and/or subsequently deposited layers. As dimensions decrease and wafer sizes increase, these undesirable effects can limit yields. Therefore, there is a need for a composition and method of reducing dielectric material polish rates in an economical fashion. A composition that demonstrates self-stopping behavior on the dielectric layer is particularly desirable.

The invention provides such a composition and method. These and other characteristics and advantages of the invention will be apparent from the description of the invention provided herein.

BRIEF SUMMARY OF THE INVENTION

The invention provides a chemical-mechanical polishing composition comprising (a) an abrasive, (b) metal ions (M) having a M-O—Si bond energy equal to or greater than about 3 kcal/mol, and (c) a liquid carrier.

The invention further provides a method of polishing a substrate comprising the steps of (a) providing a substrate, (b) providing a chemical-mechanical polishing composition comprising (i) an abrasive, (ii) metal ions (M) having a M-O—Si bond energy of about 3 kcal/mol or higher, and (iii) a liquid carrier, (c) applying the chemical-mechanical polishing composition to at least a portion of the substrates, and (d) abrading at least a portion of the substrate with the chemical-mechanical polishing composition to polish the substrate.

DETAILED DESCRIPTION OF THE INVENTION

The invention provides a chemical-mechanical polishing composition comprising (a) an abrasive, (b) metal ions, represented by "M," having a M-O—Si bond energy equal to or greater than about 3 kcal/mol, and (c) a liquid carrier.

The abrasive can be any suitable abrasive. Suitable abrasives include, for example, metal oxide abrasives, such as, alumina (e.g., α-alumina, γ-alumina, δ-alumina, and fumed alumina), ceria, chromia, germania, iron oxide, magnesia, silica (e.g., condensation-polymerized silica, fumed silica, and precipitated silica), titania, zirconia, and co-formed products thereof. There are many other suitable abrasives well known in the art, such as, for example, boron carbide, diamond, silicon carbide, titanium nitride, and tungsten carbide. The abrasive can be a mixture of two or more abrasives.

The abrasive can be present in any suitable amount. The total amount of abrasive present in the chemical-mechanical polishing composition typically is about 0.1 wt. % or more, preferably about 1 wt. % or more, and more preferably about 5 wt. % or more, based on the total weight of the chemical-mechanical polishing composition. The total amount of abrasive present in the chemical-mechanical polishing composition typically does not exceed about 25 wt. % (e.g., about 0.1 to 25 wt. %), preferably does not exceed about 20 wt. % (e.g., about 0.1 to 20 wt. %), based on the total weight of the chemical-mechanical polishing composition.

The metal ion having a M-O—Si bond energy equal to or greater than about 3 kcal/mol can be any suitable metal ion. The metal ions can have a M-O—Si bond energy equal to or greater than about 3.5 kcal/mol, equal to or greater than about 4 kcal/mol, equal to or greater than about 4.5 kcal/mol, equal to or greater than 5 kcal/mol, or equal to or greater than 6 kcal/mol. Bond energy is the energy required to disrupt the bonds in one gram-mole of a chemical compound (see, e.g., Hawley's Condensed Chemical Dictionary, Richard J. Lewis, editor, 13$^{th}$ ed. 1997).

While not intending to be bound to any particular theory, it has been discovered that chemical-mechanical polishing compositions comprising metal ions having a sufficient M-O—Si bond energy exhibit a self-stopping property, whereby excessive removal of metal from a substrate polished with the chemical-mechanical polishing composition, especially from planarized portions of the substrate, is reduced.

The metal ions desirably are $Al^{3+}$, $Cr^{3+}$, $Fe^{2+}$, $Sc^{3+}$, or combinations thereof. In a preferred embodiment, the metal ions are $Al^{3+}$.

The metal ions can be provided by any suitable means. For example, the metal ions of the chemical-mechanical polishing composition can be provided in the form of a metal salt. In a preferred embodiment, the metal salt is a metal chloride salt, such as aluminum chloride. In an alternate embodiment, the metal ions comprise non-aluminum metal ions.

Typically, the chemical-mechanical polishing composition has a concentration of metal ions of 0.005 mM or higher, about 0.01 mM or higher, about 0.025 mM or higher, about 0.05 mM or higher (e.g., about 0.05 mM to about 1 mM, about 0.06 mM to about 0.5 mM, about 0.07 mM to about 0.4 mM, or about 0.08 mM to about 0.3 mM), about 0.25 mM or higher, about 0.5 mM or higher, about 1 mM or higher, 1.5 mM or higher, about 2 mM or higher, about 5 mM or higher, about 6 mM or higher, or about 7 mM or higher. The chemical-mechanical polishing composition typically has a concentration of metal ions that does not exceed about 10 mM (e.g., up to about 8 mM, up to about 5 mM, up to about 2 mM, or up to about 1 mM). In a preferred embodiment, the chemical-mechanical polishing composition has a concentration of $Al^{3+}$ ions from about 0.05 mM to about 1 mM (e.g., a concentration of $Al^{3+}$ ions of about 0.06 mM to about 0.5 mM, about 0.07 mM to about 0.4 mM, about 0.08 mM to about 0.3 mM).

The liquid carrier can be any suitable liquid carrier, such as, for example, water. Preferably, the water is deionized water. The liquid carrier can further comprise a suitable water-miscible solvent. However, the liquid carrier typically consists essentially of, or entirely of, water, more preferably deionized water.

The chemical-mechanical polishing composition desirably has a pH of about 7 or less (e.g., a pH of about 6 or less). In a preferred embodiment, the chemical-mechanical polishing composition has a pH of about 4 to about 7 (e.g., a pH of about 5 to about 7, or a pH of about 4 to about 6). Alternate embodiments of the chemical-mechanical polishing composition may have different pH levels (e.g., a pH of about 5.7 or less, a pH of about 5.5 or less, a pH of about 5 or less, a pH of about 4.5 or less, a pH of about 4.2 to about 5.8, a pH of about 4.5 to about 5.5, a pH of about 4.7 to about 5.2, etc.). In a preferred embodiment, the chemical-mechanical polishing composition has a pH of about 4 to about 7 (e.g., a pH of about 5 to about 7) and comprises a metal salt comprising $Al^{3+}$.

The pH of the chemical-mechanical polishing composition can be achieved and/or maintained by any suitable means. More specifically, the chemical-mechanical polishing composition can further comprise a pH adjustor, a pH buffering agent, or a combination thereof. The pH adjustor can be any suitable pH-adjusting compound. For example, the pH adjustor can be potassium hydroxide, sodium hydroxide, ammonium hydroxide, or a combination thereof. The pH buffering agent can be any suitable buffering agent, for example, phosphates, acetates, borates, sulfonates, carboxylates, ammonium salts, and the like. The chemical-mechanical polishing composition can comprise any suitable amount of a pH adjustor and/or a pH buffering agent, provided such amount is sufficient to achieve and/or maintain the desired pH of the polishing composition, e.g., within the ranges set forth herein.

The chemical-mechanical polishing composition can comprise an acid. The acid can be any suitable acid, such as an inorganic or an organic acid, or a combination thereof. For example, the chemical-mechanical polishing composition can comprise an inorganic acid selected from the group consisting of nitric acid, phosphoric acid, sulfuric acid, salts thereof, and combinations thereof. The chemical-mechanical polishing composition can comprise (alternatively or in addition to the inorganic acid) an organic acid selected from the group consisting of acetic acid, anthranilic acid, benzene sulfonic acid, benzoic acid, citric acid, cyclohexane carboxylic acid, glutamic acid, glycine, 4-hydroxybenzoic acid, 3-hydroxypicolinic acid, imidazole, lactic acid, malic acid, malonic acid, metanilic acid, orthanilic acid, oxalic acid, 2-phenylacetic acid, phthalic acid, piperazine, proline, propionic acid, pyridine, 2-pyridinecarboxylic acid, 2,3-pyridinedicarboxylic acid, pyrrole-2-carboxylic acid, salicylic acid, succinic acid, tartaric acid, terephthalic acid, salts thereof, and combinations thereof. When present, the acid(s) can be present in the chemical-mechanical polishing composition in any suitable amount(s).

The chemical-mechanical polishing composition can comprise a corrosion inhibitor (i.e., a film-forming agent). The corrosion inhibitor can be any suitable corrosion inhibitor. Typically, the corrosion inhibitor is an organic compound containing a heteroatom-containing functional group. For example, the corrosion inhibitor can be a heterocyclic organic compound with at least one 5- or 6-member heterocyclic ring as the active functional group, wherein the heterocyclic ring contains at least one nitrogen atom, for example, an azole compound. Preferably, the corrosion inhibitor contains at least one azole group. More preferably, the corrosion inhibitor is selected from the group consisting of 1,2,3-triazole, 1,2,4-triazole, benzotriazole, benzimidazole, benzothiazole, and mixtures thereof. The amount of corrosion inhibitor used in the polishing composition typically is about 0.0001 wt. % to about 3 wt. % (preferably about 0.001 wt. % to about 2 wt. %) based on the total weight of the chemical-mechanical polishing composition.

The chemical-mechanical polishing composition can comprise a chelating or complexing agent. The complexing agent is any suitable chemical additive that enhances the removal rate of the substrate layer being removed. Suitable chelating or complexing agents can include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of chelating or complexing agent will depend on the type of substrate layer being removed.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The chemical-mechanical polishing composition can comprise a surfactant. Suitable surfactants can include, for example, cationic surfactants, anionic surfactants, nonionic surfactants, amphoteric surfactants, mixtures thereof, and the like. Preferably, the chemical-mechanical polishing composition comprises a nonionic surfactant. One example of a suitable nonionic surfactant is an ethylenediamine polyoxyethylene surfactant. The amount of surfactant typically is about 0.0001 wt. % to about 1 wt. % preferably about 0.001 wt. % to about 0.1 wt. % and more preferably about 0.005 wt. % to about 0.05 wt. %) based on the total weight of the chemical-mechanical polishing composition.

The chemical-mechanical polishing composition can comprise an antifoaming agent. The antifoaming agent can be any suitable anti-foaming agent. Suitable antifoaming agents include, but are not limited to, silicon-based and acetylenic diol-based antifoaming agents. The amount of anti-foaming agent present in the chemical-mechanical polishing composition typically is about 10 ppm to about 140 ppm.

The chemical-mechanical polishing composition can comprise a biocide. The biocide can be any suitable biocide, for example an isothiazolinone biocide. The amount of biocide used in the chemical-mechanical polishing composition typically is about 1 to about 50 ppm, preferably about 10 to about 20 ppm.

The chemical-mechanical polishing composition preferably is colloidally stable. The term colloid refers to the suspension of the particles in the liquid carrier. Colloidal stability refers to the maintenance of that suspension through time. A chemical-mechanical polishing composition is considered colloidally stable if, when the chemical-mechanical polishing composition is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the chemical-mechanical polishing composition ([C] in terms of g/ml) is less than or equal to 0.5 (i.e., $\{[B]-[T]\}/[C] \leq 0.5$). Preferably, the value of $[B]-[T]/[C]$ is less than or equal to 0.3, more preferably is less than or equal to 0.1, even more preferably is less than or equal to 0.05, and most preferably is less than or equal to 0.01.

The average particle size of the particles (e.g., abrasive) suspended in the chemical-mechanical polishing composition preferably remains essentially unchanged throughout the useful life of the chemical-mechanical polishing composition. In particular, the average particle size of the particles (e.g., abrasive) suspended in the chemical-mechanical polishing composition preferably increases by less than about 40% (e.g., less than about 35%, less than about 30%, less than about 25%, less than about 20%, less than about 15%, or less than about 10%) throughout the useful life of the chemical-mechanical polishing composition (e.g., about 90 days or more, about 180 days or more, or about 365 days or more).

The invention further provides a method of polishing a substrate with the chemical-mechanical polishing composition as described herein. The method generally comprises the steps of (a) providing a substrate, (b) providing a chemical-mechanical polishing composition as described herein, (c) applying the chemical-mechanical polishing composition to at least a portion of the substrate, and (d) abrading at least a portion of the substrate with the chemical-mechanical polishing composition to polish the substrate.

The substrate to be polished using the method of the invention can be any suitable substrate. Suitable substrates include, but are not limited to, integrated circuits, memory or rigid disks, metals, interlayer dielectric (ILD) devices, semiconductors, micro-electro-mechanical compositions, ferroelectrics, and magnetic heads. The substrate can comprise a metal layer. The metal layer can comprise any suitable metal. For example, the metal layer can comprise copper, tantalum (e.g., tantalum nitride), titanium, aluminum, nickel, platinum, ruthenium, iridium, or rhodium. The substrate can further comprise at least one other layer, e.g., an insulating layer. The insulating layer can be a metal oxide, porous metal oxide, glass, organic polymer, fluorinated organic polymer, or any other suitable high or low-κ insulating layer. The metal layer can be disposed on the other layer.

The inventive method of polishing a substrate is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the chemical-mechanical polishing composition of the invention, with the polishing pad moving relative to the substrate, so as to abrade at least a portion of the substrate to polish the substrate.

Desirably, the CMP apparatus further comprises an in situ polishing endpoint detection system, many of which are known in the art. Techniques for inspecting and monitoring the polishing process by analyzing light or other radiation reflected from a surface of the substrate are known in the art. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but should not be construed as in any way limiting its scope.

EXAMPLE 1

This example demonstrates the relationship between the M-O—Si bond energy of metal ions in a chemical-mechanical polishing composition and the substrate removal rate achieved with such chemical-mechanical polishing compositions.

Seven different chemical-mechanical polishing compositions (Polishing Compositions 1A, 1B, 1C, 1D, 1E, 1F, and 1G) were used to chemically-mechanically polish similar 50.8 cm (20-inch) silicon dioxide substrates. Each substrate was polished with a different chemical-mechanical polishing composition used in conjunction with a commercially available polishing pad under the following conditions for 60 seconds:

Platen Speed=60 rpm
Downforce=27.6 kPa (4 psi)
Carrier speed=56 rpm
Slurry flow rate=200 mL/min
Pad Temperature=22-30° C.

Each chemical-mechanical polishing composition comprised 0.15 weight percent of ceria with a mean particle size of 130 nm, 0.06 weight percent acid, water, and either no metal salt or 0.5 millimolar concentration of a metal salt. The pH of the chemical-mechanical polishing compositions was adjusted to 5.

Polishing Composition 1A (control) contained no metal salt. Polishing Compositions 1B, 1C, and 1D (comparative) were the same as Polishing Composition 1A except that they further contained either KCl, $MgCl_2$, or $LaCl_3$, respectively. Polishing Compositions 1E, 1F, and 1G (invention) were the same as Polishing Composition 1A except that they further contained either $ScCl_3$, $FeCl_2$, or $AlCl_3$, respectively.

The removal rate of the substrate was calculated by measuring the change in thickness of the substrate over a given period of time. The "normalized removal rate" is the substrate removal sate normalized such that the substrate removal rate for Polishing Composition 1D, which contained $LaCl_3$, was equal to 1. The M-O—Si bond energy values (kcal/mol) of the metal ion to the substrate silicon were obtained from Dugger et al., *J. Phys. Chem.*, 68:757 (1964).

The polishing composition, metal salt, substrate removal rate, normalized removal rate, and M-O—Si bond energy for the metal ion for each chemical-mechanical polishing composition are set forth in Table 1.

TABLE 1

| Polishing Composition | Metal Salt | Substrate Removal Rate (Å/min) | Normalized Removal Rate | M—O—Si Bond Energy (kcal/mol) |
|---|---|---|---|---|
| 1A (control) | — | 4450 | 5.40 | — |
| 1B (comparative) | KCl | 1247 | 1.51 | 0 |
| 1C (comparative) | $MgCl_2$ | 1079 | 1.31 | 1.1 |
| 1D (comparative) | $LaCl_3$ | 824 | 1.00 | 2.9 |
| 1E (invention) | $ScCl_3$ | 155 | 0.19 | 6.2 |
| 1F (invention) | $FeCl_2$ | 153 | 0.19 | 7.7 |
| 1G (invention) | $AlCl_3$ | 119 | 0.14 | 5.8 |

As is apparent from the results set forth in Table 1, the chemical-mechanical polishing compositions containing a metal ion with a higher M-O—Si bond energy exhibited reduced substrate removal rates. In particular, those chemical-mechanical polishing compositions containing metal ion with a M-O—Si bond energy of about 3 kcal/mol or greater, i.e., those chemical-mechanical polishing compositions containing $ScCl_3$, $FeCl_2$, or $AlCl_3$, exhibited the lowest substrate removal rates (e.g., normalized removal rates below 1, specifically 0.1-0.2).

The results of this example demonstrate that there is a correlation between the M-O—Si bond energy of a metal ion in a chemical-mechanical polishing composition and the substrate removal rate exhibited by the chemical-mechanical polishing composition and that a chemical-mechanical polishing composition containing a metal ion with a M-O—Si bond energy equal to or greater than about 3 kcal/mol exhibits a desirably low substrate removal rate.

EXAMPLE 2

This example demonstrates the relationship between the M-O—Si bond energy of metal ions in a chemical-mechanical polishing composition and the substrate removal rate achieved with such chemical-mechanical polishing compositions.

Seven different chemical-mechanical polishing compositions (Polishing Compositions 2A, 2B, 2C, 2D, 2E, 2F, and 2G) were used to chemically mechanically polish similar 50.8 cm (20-inch) silicon dioxide substrates. Each substrate was polished with a different chemical-mechanical polishing composition used in conjunction with a commercially available polishing pad under the following conditions for 60 seconds:

Platen Speed=60 rpm

Downforce=27.6 kPa (4 psi)

Carrier speed=56 rpm

Slurry flow rate=200 mL/min

Pad Temperature=22-30° C.

The chemical-mechanical polishing compositions comprised 0.15 weight percent of ceria with a mean particle size of 130 nm, 0.06 weight percent acid, water, and either no metal salt or 0.5 millimolar concentration of a metal salt. The pH of the chemical-mechanical polishing compositions was adjusted to 5.

Polishing Composition 2A (control) contained no metal salt. Polishing Compositions 2B, 2C, and 2D (comparative) were the same as Polishing Composition 2A except that they further contained either $ZnCl_2$, LiCl, or $LaCl_3$, respectively. Polishing Compositions 2E, 2F, and 2G (invention) were the same as Polishing Composition 2A except that they further contained either $ScCl_3$, $AlCl_3$, or $CrCl_3$, respectively.

The removal rate of the substrate was calculated by measuring the change in thickness of the substrate over a given period of time. The "normalized removal rate" is the substrate removal sate normalized such that the substrate removal rate for Polishing Composition 2D, which contained $LaCl_3$, was equal to 1. The M-O—Si bond energy values (kcal/mol) of the metal ion of the silicon substrate were obtained from Dugger et al., *J. Phys. Chem.*, 68:757 (1964).

The polishing composition, metal salt, substrate removal rate, normalized removal rate, and M-O—Si bond energy of the metal ion for each chemical-mechanical polishing composition are set forth in Table 2.

TABLE 2

| Polishing Composition | Metal Salt | Substrate Removal Rate (Å/min) | Normalized Removal Rate | M—O—Si Bond Energy (kcal/mol) |
|---|---|---|---|---|
| 2A (control) | — | 1599 | 2.03 | — |
| 2B (comparative) | $ZnCl_2$ | 938 | 1.19 | 1.6 |
| 2C (comparative) | LiCl | 896.5 | 1.14 | 0 |
| 2D (comparative) | $LaCl_3$ | 788.5 | 1.00 | 2.9 |
| 2E (invention) | $ScCl_3$ | 348 | 0.44 | 6.2 |
| 2F (invention) | $AlCl_3$ | 95 | 0.12 | 5.8 |
| 2G (invention) | $CrCl_3$ | 60 | 0.08 | 5.2 |

As is apparent from the results set forth in Table 2, the chemical-mechanical polishing compositions containing a metal ion with a higher M-O—Si bond energy exhibited reduced substrate removal rates. In particular, those chemical-mechanical polishing compositions containing metal ions with a M-O—Si bond energy of about 3 kcal/mol or greater, i.e., those chemical-mechanical polishing compositions containing $ScCl_3$, $AlCl_3$, or $CrCl_3$, exhibited the lowest substrate removal rates (e.g., normalized removal rates below 1, specifically 0.05-0.5).

The results of this example demonstrate that there is a correlation between the M-O—Si bond energy of a metal ion in a chemical-mechanical polishing composition and substrate removal rate exhibited by the chemical-mechanical polishing composition and that a chemical-mechanical polishing composition containing a metal ion with a M-O—Si bond energy equal to or greater than about 3 kcal/mol exhibits a desirably low substrate removal rate.

EXAMPLE 3

This example demonstrates the relationship between the pH of a chemical-mechanical polishing composition and the substrate removal rate achieved with such a chemical-mechanical polishing composition.

Five different chemical-mechanical polishing compositions (Polishing Compositions 3A, 3B, 3C, 3D, and 3E) were evaluated, with each chemical-mechanical polishing composition being the same except for having a different pH (i.e., 3, 4, 5, 6, or 7, respectively).

Each chemical-mechanical polishing composition was used to chemically-mechanically polish similar 50.8 cm (20-inch) silicon dioxide substrates. Each substrate was polished with a different chemical-mechanical polishing composition used in conjunction with a commercially available polishing pad under the following conditions for 60 seconds:

Platen Speed=60 rpm

Downforce=27.6 kPa (4 psi)

Carrier speed=56 rpm

Slurry flow rate=200 mL/min

Pad Temperature=22-30° C.

The chemical-mechanical polishing compositions comprised 0.15 weight percent of ceria with a mean particle size of 130 nm, 0.06 weight percent acid, and water (i.e., no metal salt was present). The foregoing procedure was repeated with the same chemical-mechanical polishing compositions, except that 0.5 mM $AlCl_3$ was added to each chemical-mechanical polishing composition.

The substrate removal rate was measured for each chemical-mechanical polishing composition, with and without the metal salt $AlCl_3$, at a specified pH. The removal rate of the substrate was calculated by measuring the change in thickness of the substrate over a given period of time. The ratio of the substrate removal rate achieved by the chemical-mechanical polishing composition with $AlCl_3$ to the substrate removal rate achieved by the corresponding chemical-mechanical polishing composition without AlCl$_3$ was determined.

The polishing composition, pH, substrate removal rate, substrate removal rate with AlCl$_3$, and ratio of the two substrate removal rates for each chemical-mechanical polishing composition are set forth in Table 3.

TABLE 3

| Polishing Composition | pH | Substrate Removal Rate (Å/min) (control) | Substrate Removal Rate with AlCl$_3$ (Å/min) (invention) | Ratio of Substrate Removal Rates |
|---|---|---|---|---|
| 3A | 3 | 588 | 50 | 0.085 |
| 3B | 4 | 848 | 10 | 0.012 |
| 3C | 5 | 4113 | <10 | 0.0024 |
| 3D | 6 | 4620 | 4083 | 0.88 |
| 3E | 7 | 2670 | 2350 | 0.88 |

The results set forth in Table 3 demonstrate the beneficial impact of a metal salt, specifically AlCl$_3$, on retarding the substrate removal rate achieved by chemical-mechanical polishing compositions. As is also apparent from the results set forth in Table 3, there is a pH dependent behavior to substrate removal rates for chemical-mechanical polishing compositions containing a metal salt. In particular, the substrate removal rate achieved by chemical-mechanical polishing compositions containing the metal salt AlCl$_3$ is lowest at a pH of about 5, but the metal salt AlCl$_3$ still had a retardation effect on the substrate removal rate achieved by the chemical-mechanical polishing composition at pH levels below about 5, and as low as a pH of about 3. When the pH rises above about 6, the metal salt AlCl$_3$ demonstrated a decreased retardation effect on the substrate removal rate achieved by the chemical-mechanical polishing compositions.

EXAMPLE 4

This example demonstrates the relationship between the concentration of a metal ion having a M-O—Si bond energy of about 3 or greater in a chemical-mechanical polishing composition and the substrate removal rate achieved with such a chemical-mechanical polishing composition.

Four different chemical-mechanical polishing compositions (Polishing Compositions 4A, 4B, 4C, and 4D) were used to chemically-mechanically polish similar 50.8 cm (20-inch) silicon dioxide substrates. Each substrate was polished with a different chemical-mechanical polishing composition used in conjunction with a commercially available polishing pad under the following conditions for 60 seconds:

Platen Speed=60 rpm
Downforce=4 psi
Carrier speed=56 rpm
Slurry flow rate=200 mL/min
Pad Temperature=22-30° C.

The chemical-mechanical polishing compositions comprised 0.15 weight percent of ceria with a mean particle size of 130 nm, 0.06 wt % acid, water, and either 0, 0.05, 0.5, or 5 mM AlCl$_3$.

The substrate removal rate was determined by measuring the change in thickness of the substrate over a given period of time. The "normalized removal rate" is the substrate removal rate normalized to the substrate removal rate of a chemical-mechanical polishing composition containing no AlCl$_3$.

The polishing composition, AlCl$_3$ concentration, substrate removal rate, and normalized removal rate for each chemical-mechanical polishing composition are set forth in Table 4.

TABLE 4

| Polishing Composition | AlCl$_3$ Concentration (mM) | Substrate Removal Rate (Å/min) | Normalized Removal Rate |
|---|---|---|---|
| 5A (control) | 0 | 3761 | 1.0 |
| 5B (comparative) | 0.05 | 2277 | 0.6 |
| 5C (invention) | 0.5 | <10 | <0.0026 |
| 5D (invention) | 5 | <10 | <0.0026 |

As is apparent from the results set forth in Table 4, there is a correlation between the concentration of a metal ion having a M-O—Si bond energy equal to or greater than about 3 in a chemical-mechanical polishing composition and the substrate removal rate exhibited by the chemical-mechanical polishing composition. The decrease in the substrate removal rate is exhibited at concentrations of the metal salt of about 0.05 mM or more, is quite substantial at concentrations of the metal salt of about 0.5 mM or more, and levels off at concentrations of the metal salt of about 5 mM or more.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing composition consisting essentially of:
   (a) about 0.1 wt. % to about 20 wt. % of an abrasive consisting of ceria,
   (b) $Al^{3+}$ ions, wherein the concentration of $Al^{3+}$ ions is about 0.25 mM to about 5 mM,
   (c) an organic acid, and
   (d) a liquid carrier, wherein the chemical-mechanical polishing composition has a pH of about 3 to about 5.7.

2. The chemical-mechanical polishing composition of claim 1, wherein the source of the $Al^{3+}$ ions is provided in the form of an aluminum salt.

3. The chemical-mechanical polishing composition of claim 2, wherein the aluminum salt is an aluminum chloride salt.

4. The chemical-mechanical polishing composition of claim 1, wherein the concentration of $Al^{3+}$ ions is from about 0.25 mM to about 2 mM.

5. The chemical-mechanical polishing composition of claim 1, wherein the concentration of $Al^{3+}$ ions is about 0.25 mM to about 1 mM.

6. The chemical-mechanical polishing composition of claim 1, wherein the concentration of $Al^{3+}$ ions is about 0.25 mM to about 1.5 mM.

7. The chemical-mechanical polishing composition of claim 1, wherein the concentration of $Al^{3+}$ ions is about 0.25 mM to about 0.5 mM.

8. The chemical-mechanical polishing composition of claim 1, wherein the concentration of $Al^{3+}$ ions is about 0.25 mM to about 0.4 mM.

9. A chemical-mechanical polishing composition consisting essentially of:
   (a) about 0.1 wt. % to about 20 wt. % of an abrasive consisting of ceria,
   (b) $Al^{3+}$ ions, wherein the concentration of $Al^{3+}$ ions is about 0.25 mM to about 5 mM,
   (c) an organic acid,
   (d) a liquid carrier, and
   (e) a biocide,
   wherein the chemical-mechanical polishing composition has a pH of about 3 to about 5.7.

10. A method of polishing a substrate comprising the steps of:
    (a) providing a substrate,
    (b) providing a chemical-mechanical polishing composition consisting essentially of:
        (i) about 0.1 wt. % to about 20 wt. % of an abrasive consisting of ceria,
        (ii) $Al^{3+}$ ions, wherein the concentration of $Al^{3+}$ ions is about 0.25 mM to about 5 mM,
        (iii) an organic acid, and
        (iv) a liquid carrier, wherein the chemical-mechanical polishing composition has a pH of about 3 to about 5.7,
    (c) applying the chemical-mechanical polishing composition to at least a portion of the substrate, and
    (d) abrading at least a portion of the substrate with the chemical-mechanical polishing composition to polish the substrate.

11. The method of claim 10, wherein the $Al^{3+}$ ions are provided in the form of an aluminum salt.

12. The method of claim 11, wherein the aluminum salt is an aluminum chloride salt.

13. The method of claim 10, wherein the concentration of $Al^{3+}$ ions is from about 0.25 mM to about 2 mM.

14. The method of claim 10, wherein the concentration of $Al^{3+}$ ions is about 0.25 mM to about 1 mM.

15. The method of claim 10, wherein the concentration of $Al^{3+}$ ions is about 0.25 mM to about 1.5 mM.

16. The method of claim 10, wherein the concentration of aluminum ions is about 0.25 mM to about 0.5 mM.

17. The method of claim 10, wherein the concentration of $Al^{3+}$ ions is about 0.25 mM to about 0.4 mM.

18. The method of claim 10, wherein the substrate comprises a first metal layer disposed on a second layer.

19. A method of polishing a substrate comprising the steps of:
    (a) providing a substrate,
    (b) providing a chemical-mechanical polishing composition consisting essentially of:
        (i) about 0.1 wt. % to about 20 wt. % of an abrasive consisting of ceria,
        (ii) $Al^{3+}$ ions, wherein the concentration of $Al^{3+}$ ions is about 0.25 mM to about 5 mM,
        (iii) an organic acid,
        (iv) a liquid carrier, and
        (v) a biocide,
        wherein the chemical-mechanical polishing composition has a pH of about 3 to about 5.7,
    (c) applying the chemical-mechanical polishing composition to at least a portion of the substrate, and
    (d) abrading at least a portion of the substrate with the chemical-mechanical polishing composition to polish the substrate.

* * * * *